(12) United States Patent
Halderman et al.

(10) Patent No.: US 6,417,563 B1
(45) Date of Patent: Jul. 9, 2002

(54) SPRING FRAME FOR PROTECTING PACKAGED ELECTRONIC DEVICES

(75) Inventors: Jonathan Halderman; Mohammad Khan, both of San Jose; Alexander C. Tain, Milpitas; Tom Ley, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/617,102

(22) Filed: Jul. 14, 2000

(51) Int. Cl.[7] .................................................. H05K 7/20
(52) U.S. Cl. ........................ 257/718; 257/707; 257/719; 361/719
(58) Field of Search ................................. 361/707, 709, 361/717–720; 257/706, 707, 712, 713, 717–719; 174/252; 438/122

(56) References Cited

U.S. PATENT DOCUMENTS

| | | | | |
|---|---|---|---|---|
| 4,970,579 A | * | 11/1990 | Arldt et al. .................. | 257/718 |
| 5,155,661 A | * | 10/1992 | Nagesh et al. ............... | 257/707 |
| 5,243,218 A | * | 9/1993 | Zenitani et al. .............. | 257/712 |
| 5,729,435 A | * | 3/1998 | Iijima et al. ................. | 361/717 |
| 5,930,114 A | * | 7/1999 | Kuzmin et al. .............. | 361/719 |
| 6,252,776 B1 | * | 6/2001 | Saito et al. .................. | 361/719 |
| 6,278,615 B1 | * | 8/2001 | Brezina et al. .............. | 361/709 |
| 6,310,773 B1 | * | 10/2001 | Yusuf et al. ................. | 257/719 |

* cited by examiner

Primary Examiner—David L. Talbott
Assistant Examiner—John B. Vigushin

(57) ABSTRACT

An integrated circuit arrangement comprising an integrated circuit package having a package board. An integrated circuit die is mounted to a surface of the package board. A spring frame is mounted to the package board surface at a pair of opposite frame bends. The spring frame has a central opening that receives the integrated circuit die. Sides of the spring frame away from the bends are raised from the package surface. A heat sink is mounted to the spring frame such that a bottom of the heat sink contacts an upper surface of the integrated circuit die as the heat sink pushes the sides of the spring frame toward the package surface.

25 Claims, 4 Drawing Sheets

SPRING FRAME FOR PROTECTING PACKAGED ELECTRONIC DEVICES

FIELD OF THE INVENTION

The present invention relates to integrated circuit arrangements and, more particularly, to the attachment of a heat sink to an integrated circuit die.

DESCRIPTION OF RELATED ART

Integrated circuit devices mounted to integrated circuit package boards generate large amounts of heat when operated. The generated heat must be dissipated, otherwise the life of the circuit devices will be shortened and the effectiveness of the circuit devices degraded.

A common arrangement for dissipating heat is to utilize a thermally conductive lid that covers and protects a circuit device. Sometimes the increased surface area of the lid is not enough to dissipate sufficient quantities of heat, so a heat sink is mounted to the lid to enhance heat dissipation. Adding a lid to an integrated circuit arrangement, however, increases the cost of the arrangement and increases manufacturing complexity. Therefore, many integrated circuit arrangements do not include a lid for covering and protecting a circuit device, but there remains a need to dissipate excess heat generated by circuit devices.

Accordingly, another common arrangement for dissipating heat is to utilize a heat sink mounted directly onto a circuit device. Heat sinks are manually mounted directly to the circuit device to thermally couple the circuit device and the heat sink. Typically, a heat sink is constructed from highly thermally conductive materials and is exposed to the ambient air or to air moved by some type of cooling fan. The heat sink, thermally coupled to the integrated circuit device, draws heat from the circuit device through conduction. The ambient air, or air moved by the cooling fan, passes over the heat sink to cool the heat sink by convection. As a result, the heat generated by the circuit device is dissipated to the surrounding air.

There are problems related to manually mounting a heat sink directly to a circuit device. Some of these problems relate to the fact that the surface area of a heat sink is large compared to the surface area of a circuit device. It is difficult to properly align a heat sink on top of a circuit device because a person manually mounting the heat sink cannot easily see the circuit device. The relatively small surface area of a circuit device also makes it easy to mount the heat sink at an angle, so that the plane formed by the bottom of the heat sink is not parallel with the plane formed by the top of the circuit device.

Improper alignment of a heat sink on a circuit device leads to inefficient use of the heat sink. An efficient placement for a heat sink is centering the heat sink on the circuit device. Centering the heat sink on the circuit device provides even dissipation of heat generated by the device throughout the entire heat sink. When the heat sink is not properly centered, some portions of the heat sink become hotter than other portions, resulting in uneven and slower heat dissipation from the device to the heat sink. As a result of the uneven dissipation of generated heat, the circuit device may overheat and become damaged, thereby degrading the device's performance and shortening its operational life.

In addition to mis-centering, a poor thermal interface between the heat sink and the circuit device may occur when the heat sink is not flatly mounted, i.e., the plane formed by the underside of the heat sink is not parallel with the plane formed by the top of the circuit device. An optimal thermal interface occurs when the heat sink is flatly mounted onto the circuit device so that the heat sink is as close as possible to the circuit device, and there is a minimum amount of adhesive between the circuit device and the heat sink. However, when a heat sink is manually mounted onto a circuit device it is easy to improperly mount the heat sink at an angle, instead of flatly on the circuit device. An angle between the heat sink and the circuit device means that a portion of the heat sink is unnecessarily located away from the circuit device, and there will be greater quantities of adhesive between the heat sink and the circuit device, resulting in a poor thermal interface. A poor thermal interface reduces conduction between the device and the heat sink, thereby reducing the heat sink's ability to dissipate heat generated by the circuit device. This creates the possibility that the circuit device will overheat and become damaged which degrades the device's performance and shortens its operational life.

Even when a heat sink is properly centered and flatly mounted on a circuit device, several problems can arise. Too much pressure on an edge of a heat sink when connecting an integrated circuit package to a motherboard, for example, creates a force strong enough to tilt or disconnect the heat sink from the circuit device. Rocking of the heat sink, if the integrated circuit package is part of a laptop computer or the electronics in a vehicle for example, could also occur. Rocking of a heat sink on a circuit device results in the device becoming chipped or the heat sink losing optimal thermal contact with the device, either of which detrimentally affects the performance of the device and its operational life.

SUMMARY OF THE INVENTION

There is a need for a heat sink mounting that reduces the tilting of a heat sink during installation and operation of the electronic unit in which an integrated circuit arrangement is incorporated, that reduces the risk of damage to the integrated circuit die, and that allows flat thermal contact between the die and the heat sink.

These and other needs are met by embodiments of the present invention which provide a spring-like structure substantially surrounding a die and partially supporting a heat sink.

Accordingly, one aspect of the invention provides a cool spring frame comprising a metal frame having two bends about which the frame flexes, wherein the bends are adapted to be attached to a package board surface. A central opening in the center of the metal frame allows the frame to surround an integrated circuit die mounted on the package board surface.

Accordingly, another aspect of the invention provides a compliant structure comprising polymer components substantially surrounding an integrated circuit die. The height of the compliant structure is greater than the height of the die, and the compliant structure is compressed when a heat sink is mounted to the die, preventing the heat sink from tilting during or after attachment.

The use of a spring-like structure to mount the heat sink to the integrated circuit die and to the package face promotes flat thermal contact between the heat sink and the circuit die. The spring-like structure prevents the heat sink from tilting during installation and operation of the integrated circuit arrangement and prevents damage to the die during heat sink installation and removal. The spring-like structure also reduces the heat sink attachment force on the backside of the integrated circuit die.

Additional advantages and novel features of the invention will be set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWINGS

Preferred embodiments of the invention will be described with reference to the drawings, which are incorporated in and constitute a part of the specification, in which.

DETAILED DESCRIPTION OF THE INVENTION

Figure 1C:
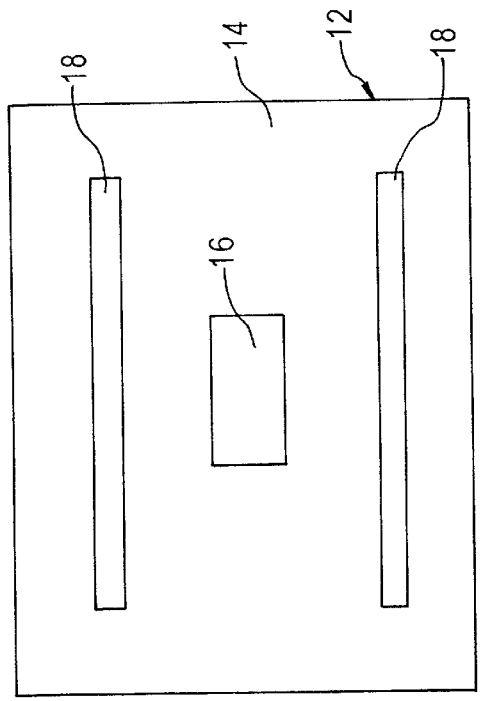
FIGS. 1B–1D are top views of an integrated circuit arrangement depicting embodiments of the present invention in the form of a compliant polymer ring, compliant polymer strips, and compliant polymer bumps, respectively.
Figure 1D:
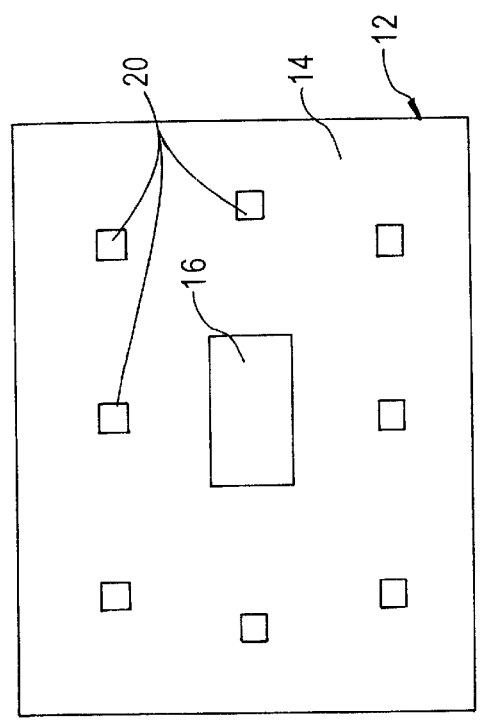
Figure 1B:
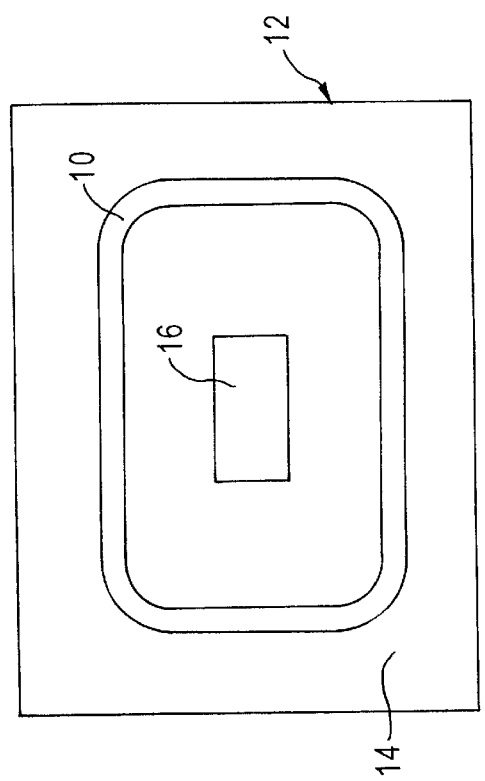
Figure 1A:
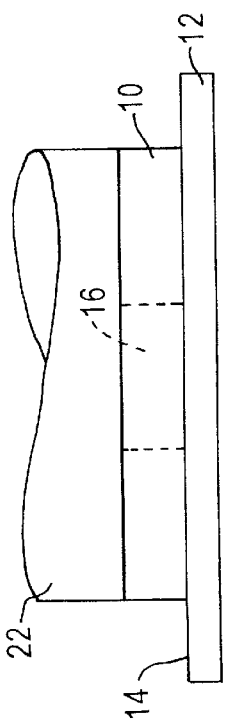
FIG. 1A is a side view of a spring-like compliant polymer ring in an integrated circuit arrangement according to one embodiment of the present invention.

Referring now to the drawings, FIGS. 1A and 1B depict a compliant polymer ring 10 for mounting a heat sink 22, partially shown in FIG. IA, to the package board surface 14 and to an integrated circuit die 16. The compliant polymer ring 10 lies on the package surface 14 and surrounds the die 16, and may be attached to the package surface via an adhesive, for example. The compliant polymer ring 10 is thicker than the maximum possible die height because the compliant polymer ring 10 advantageously compresses when the heat sink 22 is attached to the die 16. The compliant polymer ring 10 supports the heat sink 22 during installation and operation of the integrated circuit arrangement. As a result, the heat sink 22 is able to flatly contact the die 16, and tilting of the heat sink 22 with respect to the die 16 is reduced.

There are other possible compliant spring-like structures for mounting heat sinks to integrated circuit packages and protecting integrated circuits; compliant polymer strips and compliant bumps of adhesive (or other curable polymer), for example. FIG. 1C depicts compliant polymer strips 18 that are similar to the compliant polymer ring 10 of FIG. 1B, except that several pieces of compliant polymer are used rather than a single continuous polymer ring 10. FIG. 1D depicts compliant bumps of adhesive 20 that apply the same concept as the strips 18 and the ring 10, except that a curable polymer is used rather than a pre-cured polymer. The adhesive bumps 20 are more easily integrated into a high volume manufacturing process, but a high viscosity polymer must be used to ensure that the polymer does not spread between the dispensing and the curing steps.

Figure 2C:
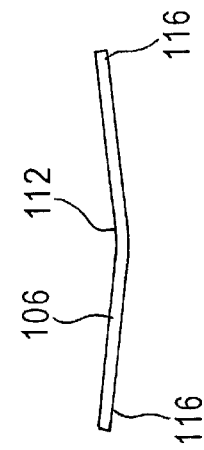
FIGS. 2A–2C are several views of a cool spring frame according to an embodiment of the invention.
Figure 2B:
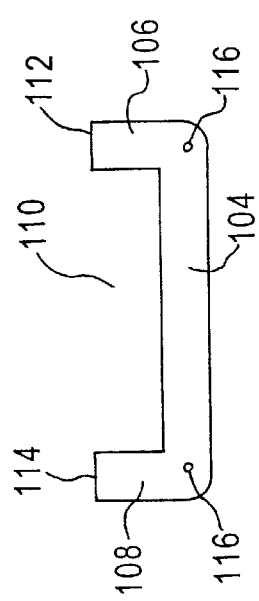
Figure 2A:
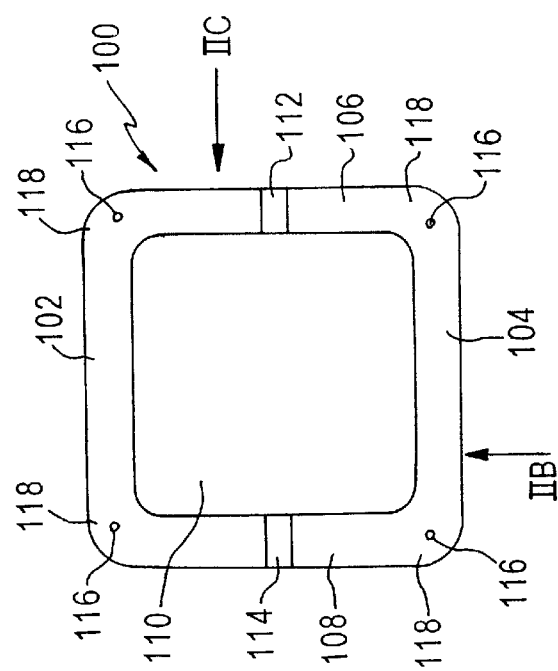

Referring now to FIG. 2A, there will be seen a top view of a spring frame 100 for an integrated circuit die according to the invention. FIG. 2B is an upside down side view taken along IIB of FIG. 2A. FIG. 2C is another side view taken along arrow IIC of FIG. 2A.

FIGS. 2A–2C show a substantially square spring frame 100 having four sides 102, 104, 106, 108 of equal lengths. Although the spring frame 100 of FIGS. 2A–2C is square, the frame may take any shape including, but not limited to, rectangular, polygonal, circular, and trapezoidal without departing from the invention.

The spring frame 100 has an opening 110 defined by the four sides 102, 104, 106, 108. As best seen in FIG. 2A, the spring frame 100 has bends 112, 114 in two opposing sides 106, 108 of the spring frame 100. As a result of the bends 112, 114, the sides 102, 104 do not lie in the same horizontal plane as the bends 112, 114 as seen in FIG. 2C.

The spring frame 100 has a plurality of dimples 116 in its corners 118. In the embodiment shown, each dimple 116 comprises a shallow recess in the top surface of the frame and extends beyond the bottom surface of the frame.

The spring frame 100 of FIGS. 2A–2C is made of a metal, which is preferably an anodized aluminum. Other materials may be used, however, without departing from the invention.

Figure 3C:
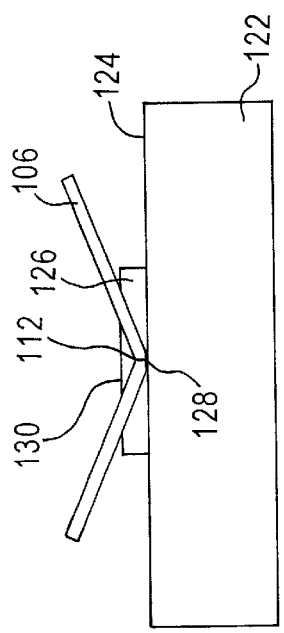
FIGS. 3A–3C are several views of a package having a cool spring frame according to the embodiment of the invention in FIGS. 2A–2C.
Figure 3B:
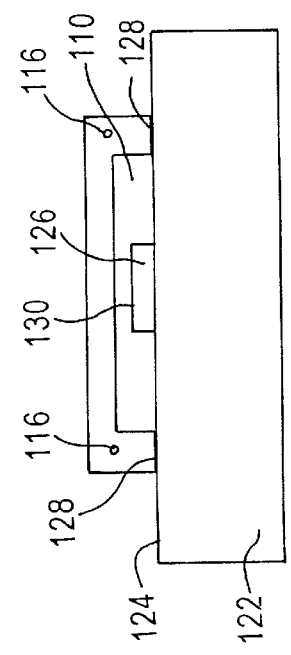
Figure 3A:
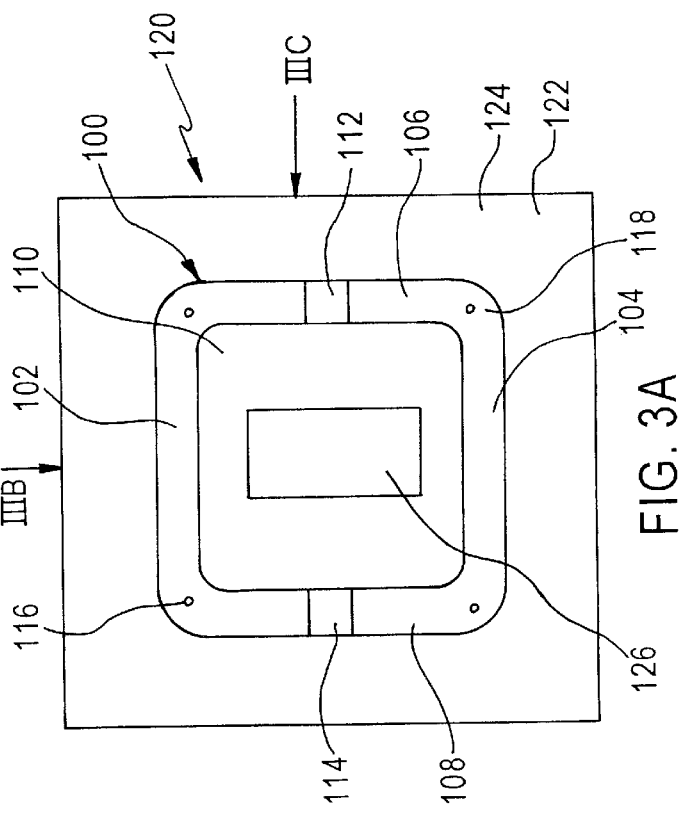

A package arrangement 120 according to an embodiment of the invention is shown in FIGS. 3A–3C. FIG. 3A is a top view of the package arrangement. FIG. 3B is a side view of the package arrangement 120 taken along the arrow IIIB of FIG. 3A and FIG. 3C is a side view taken along the arrow IIIC of FIG. 3A.

As shown in FIGS. 3A–3C, the package arrangement 120 includes a spring frame 100 according to the embodiment of FIGS. 2A–2C and a package board 122. As seen in FIG. 3C, only the bends 112, 114 of the spring frame 100 are mounted to the package board surface 124 with adhesive 128. An integrated circuit die 126 having an upper surface 130 is contained in the opening 110 of the spring frame. In other words, the sides 102, 104, 106, 108 of the spring frame 100 completely surround the integrated circuit die 126.

As seen in FIGS. 3B and 3C, the bends 112, 114 are mounted to the package board surface 124 with adhesive 128, thereby causing sides 102, 104 to be elevated or flexed away from the package board surface 124. The sides 102, 104 are elevated such that, when there is no heat sink mounted, the sides 102, 104 extend above the maximum height of an upper surface 130 of the integrated circuit die 126.

The dimples 116 prevent the metal of the spring frame 100 from contacting any exposed traces on the package board surface 124. The dimples 116 are arranged on the corners 118 such that when the spring frame is completely flexed, i.e., a large force on an edge of a heat sink causes the heat sink to detach and tilt, only the bottom of the dimple contacts the package surface 124 and then only where there are no exposed traces on the package surface 124.

Figure 4:
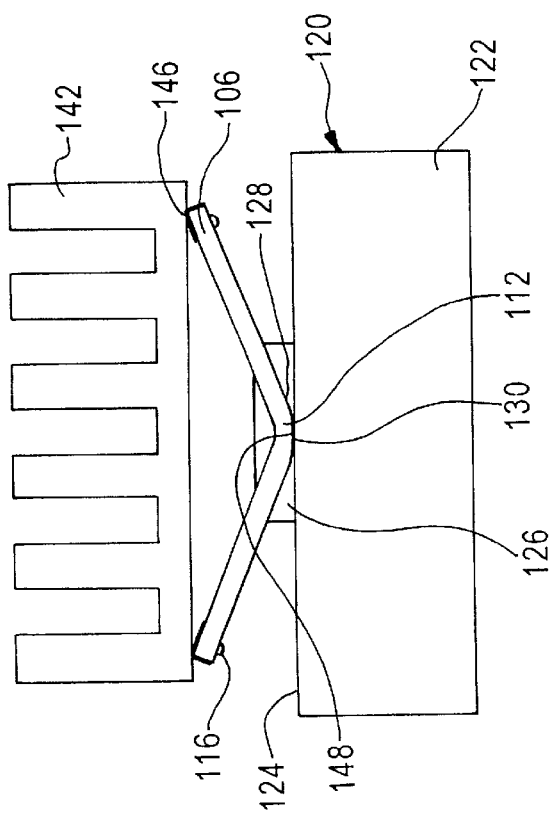
FIG. 4 is a side view of an integrated circuit arrangement having a cool spring frame according to an embodiment of the invention during the process of mounting the heat sink to the spring frame and circuit die.

As shown in FIG. 4, a heat sink 142 is mounted to the integrated circuit package arrangement 120. The heat sink 142 is brought into contact with the flexed away sides 102, 104 of the spring frame 100. The heat sink 142 is pressed down (or counter flexed), either manually or automatically, such that the heat sink 142 eventually contacts an adhesive 146 placed on the flexed away sides 102, 104 of the spring frame 100. The heat sink 142 is further pressed down until the bottom surface of the heat sink 142 contacts the upper surface 130 of the integrated circuit die 126, which has adhesive 148 placed thereon. The adhesive 148 on the top surface 130 of the integrated circuit die acts to hold the heat sink in contact with the die 126 and is thermally conductive.

Figure 5:
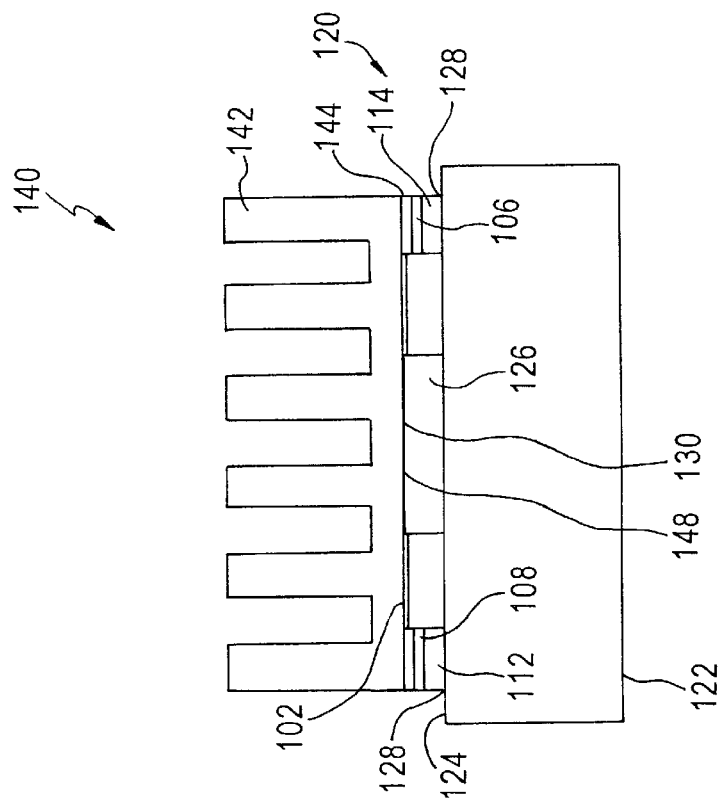
FIG. 5 is a side sectional view of an integrated circuit arrangement having a cool spring frame according to an embodiment of the invention with a heat sink mounted thereto.

An embodiment of an integrated circuit arrangement 140 according to the invention is shown in FIG. 5, which is a sectional side view of the integrated circuit arrangement 140. The integrated circuit arrangement 140 includes the integrated circuit package 120 of FIGS. 3A–3D including the spring frame 100. As shown in FIG. 5, a heat sink 142 is mounted to the spring frame 100 such that the bottom surface of the heat sink 144 is in contact with the upper surface 130 of the integrated circuit die 126 via the thermally conductive adhesive 148.

When the heat sink 142 is attached to the package 120, the heat sink 142 first contacts the spring frame 100. Because the heat sink 142 does not contact the die 126 first, the heat sink 142 is prevented from tilting and damaging the die 126. As the heat sink 142 is forced downward (either by hand or via a machine during the assembly process), the corners of the spring frame 100 move toward the package board surface 124 and continually support the heat sink 142 until the die 126 and the heat sink 142 are in contact. Once the contact between the die 126 and the heat sink 142 has been established, epoxy, which was already placed on the upper surface of the die 126, holds the heat sink 142 in place and in contact with the die 126.

The spring frame according to the invention has several advantages over previous arrangements. The spring frame ensures that there will be flat contact between the backside of the die and the heat sink at all times because the spring frame has a spring force and thus responds to shifting of the heat sink. Moreover, the spring frame is not affected by the level of heat generated in the integrated circuit environment and, therefore, its properties will not change substantially over time. The spring frame is also easy to rework and remove if necessary.

The spring frame is also much more advantageous for manufacturing reasons. For example, because the spring frame is made from a simple stamping procedure, it is cost effective and can be integrated into many existing manufacturing processes. Also, the stamping process, which simply punches out the center portion of the metal blank, yields recoverable recyclable waste that reduces the cost of production.

Another advantage of the spring frame is the rigid structure it provides during handling and installation of the integrated circuit arrangement. Moreover, the spring frame provides an additional surface for marking the parts prior to their distribution. In addition, an OEM or end user cannot tear the spring frame when working around the package. Lastly, the spring frame is designed to prevent the exposed traces on the package board surface from shorting.

While this invention has been described in connection with what is presently considered to be the most practical and preferred embodiments, it is to be understood that the invention is not limited to the disclosed embodiments, but, on the contrary, is intended to cover various modifications and equivalent arrangements included within the scope of the appended claims.

What is claimed is:

1. A spring frame for an integrated circuit package comprising:
    a metal frame having bends about which the metal frame flexes, wherein the bends are adapted to be attached to a package board surface such that the metal frame is flexed away from the package board surface when the bends are attached to the package board surface; and
    a central opening in the center of the metal frame adapted to receive therethrough and circumferentially surround an integrated circuit die mounted on the package board surface.

2. A spring frame as claimed in claim 1, wherein the metal frame is substantially square in shape.

3. A spring frame as claimed in claim 2, wherein the frame has two opposing flexed sides, and two opposing non-flexed sides.

4. A spring frame as claimed in claim 1, further comprising a plurality of dimples in the metal frame adapted to prevent contact between flexed portions of the metal frame and the package board surface.

5. A spring frame as claimed in claim 1, wherein the metal frame comprises aluminum.

6. A spring frame as claimed in claim 1, wherein the metal frame includes heat sink attachment surfaces adapted to receive a heat sink through which a counter flex force is transmitted to the frame in the direction of the package board surface.

7. An integrated circuit package comprising:
    a package board;
    an integrated circuit die mounted to a surface of the package board; and
    a spring frame mounted to the package board surface at a pair of opposite frame bends and having a central opening that receives therethrough and circumferentially surrounds the integrated circuit die, wherein a portion of the frame remote from the bends is biased away from the package board surface;
    wherein the spring frame further comprises a plurality of dimples that prevent the biased portion of the frame from contacting the package board surface except at the dimples.

8. An integrated circuit package as claimed in claim 7, wherein the spring frame comprises a metal.

9. An integrated circuit package as claimed in claim 8, wherein the spring frame comprises aluminum.

10. An integrated circuit package as claimed in claim 7, wherein a maximum thickness of the spring frame is less than a minimum thickness of the integrated circuit die.

11. An integrated circuit package as claimed in claim 10, wherein the spring frame is substantially square.

12. An integrated circuit package as claimed in claim 11, wherein corners of the spring frame are higher than a top of the integrated circuit die.

13. An integrated circuit package as claimed in claim 7, further comprising an adhesive that mounts the frame bends to the integrated package surface.

14. An integrated circuit arrangement comprising:
    an integrated circuit package having:
        a package board;
        an integrated circuit die mounted to a surface of the package board; and
        a spring frame mounted to the package board surface at a pair of opposite frame bends and having a central opening that receives therethrough and circumferentially surrounds the integrated circuit die, wherein a portion of the frame away from the bends is raised from the package surface; and
    a heat sink mounted to the spring frame such that a bottom of the heat sink contacts an upper surface of the integrated circuit die;
    wherein the spring frame further comprises a plurality of dimples that prevent the raised portion of the frame from contacting the package board surface.

15. An integrated circuit arrangement as claimed in claim 14, wherein the heat sink is mounted to raised portion of the spring frame.

16. An integrated circuit arrangement as claimed in claim is, wherein the spring frame comprises a metal.

17. An integrated circuit arrangement as claimed in claim 16, wherein the spring frame comprises aluminum.

18. An integrated circuit arrangement as claimed in claim 14, wherein the heat sink is mounted to the dimples of the spring frame.

19. An integrated circuit arrangement as claimed in claim 14, wherein a maximum thickness of the spring frame is less than a minimum thickness of the integrated circuit die.

20. An integrated circuit arrangement as claimed in claim 19, wherein the spring frame is substantially square.

21. An integrated circuit arrangement as claimed in claim 14, wherein corners of the spring frame are higher than a top of the integrated circuit die.

22. An integrated circuit arrangement as claimed in claim 21, wherein the heat sink is mounted to the corners of the spring frame.

23. An integrated circuit package as claimed in claim 14, further comprising an adhesive that mounts the frame bends to the package board surface.

24. An integrated circuit arrangement comprising:

an integrated circuit die coupled to a surface of an integrated circuit package;

a heat sink having a lower surface mounted onto the integrated circuit die; and a single compliant polymer structure substantially surrounding the integrated circuit die, the compliant polymer structure having a lower surface attached to the surface of the integrated circuit package via an adhesive and an upper surface configured to receive the lower surface of the heat sink, wherein in the height of the single compliant polymer structure is greater than the height of the integrated circuit die and the single compliant polymer structure is compressed when attaching the lower surface of the heat sink to the integrated circuit die and provides a spring-like force to the lower surface of the heat sink preventing the heat sink from tilting.

25. The arrangement of claim 24, wherein:

the complaint polymer structure is one of a ring, strips, or bumps.

* * * * *